United States Patent
Boomgarden et al.

(10) Patent No.: US 8,979,194 B2
(45) Date of Patent: Mar. 17, 2015

(54) PASSENGER SEAT FOR A SYSTEM OF SEATS OF AN AIRCRAFT CABIN

(75) Inventors: Gunter Boomgarden, Scharbeutz (DE);
Mark Niedostatek, Wenzendorf (DE);
Wolfgang Rittner, Ahrensbok (DE);
Rüdiger Meckes, Berkenthin (DE)

(73) Assignee: Zodiac Aerotechnics, Plaisir (FR)

( * ) Notice: Subject to any disclaimer, the term of this patent is extended or adjusted under 35 U.S.C. 154(b) by 139 days.

(21) Appl. No.: 13/546,003

(22) Filed: Jul. 11, 2012

(65) Prior Publication Data

US 2013/0020845 A1 Jan. 24, 2013

Related U.S. Application Data

(60) Provisional application No. 61/506,206, filed on Jul. 11, 2011.

(30) Foreign Application Priority Data

Jul. 11, 2011 (EP) .................................... 11173449

(51) Int. Cl.
| | | |
|---|---|---|
| A47C 31/00 | (2006.01) | |
| B64D 11/06 | (2006.01) | |
| H01L 35/30 | (2006.01) | |
| B64D 11/00 | (2006.01) | |
| H02N 2/18 | (2006.01) | |

(52) U.S. Cl.
CPC ................ B64D 11/06 (2013.01); H01L 35/30 (2013.01); *B64D 11/0015* (2013.01); *B64D 2011/0627* (2013.01); *B64D 2011/0637* (2013.01); *H02N 2/18* (2013.01); *Y02T 50/53* (2013.01)
USPC .................... 297/217.3; 297/217.1

(58) Field of Classification Search
CPC ..................... B60R 25/1004; B64D 11/0015
USPC .................... 297/217.1, 217.3, 248
See application file for complete search history.

(56) References Cited

U.S. PATENT DOCUMENTS

| | | | | |
|---|---|---|---|---|
| 6,578,916 | B2 * | 6/2003 | Longhi et al. ............ | 297/284.3 |
| 7,523,803 | B2 * | 4/2009 | Breed .......................... | 180/273 |
| 2007/0061847 | A1 * | 3/2007 | Callahan et al. .............. | 725/76 |
| 2009/0005936 | A1 * | 1/2009 | Browne et al. ................. | 701/45 |
| 2009/0243842 | A1 * | 10/2009 | Mitchell et al. .......... | 340/539.26 |
| 2009/0243892 | A1 * | 10/2009 | Cheung ........................ | 340/945 |

FOREIGN PATENT DOCUMENTS

| | | |
|---|---|---|
| DE | 10223419 | 3/2004 |
| EP | 0476356 | 3/1992 |

(Continued)

OTHER PUBLICATIONS

European Search Report for EP 11173449.7 dated Jan. 20, 2012.

*Primary Examiner* — Philip Gabler
(74) *Attorney, Agent, or Firm* — Kilpatrick Townsend & Stockton LLP; Dean W. Russell; Davidson G. Lucas

(57) ABSTRACT

Passenger seat for a system of passenger seats of an aircraft cabin, comprising:
  a seat body,
  an energy harvesting system for providing electrical energy, in particular for use in the passenger seat electrical net and/or aircraft electrical net, wherein an energy harvesting device of the energy harvesting system is provided to the seat body, wherein
  the energy harvesting device is adapted for capturing from the seat body ambient energy.

23 Claims, 2 Drawing Sheets

(56) References Cited

FOREIGN PATENT DOCUMENTS

| | | |
|---|---|---|
| GB | 2430118 | 3/2007 |
| GB | 2441851 | 3/2008 |
| WO | 2004039623 | 5/2004 |
| WO | 2011042611 | 4/2011 |

* cited by examiner

PASSENGER SEAT FOR A SYSTEM OF SEATS OF AN AIRCRAFT CABIN

CROSS-REFERENCE TO RELATED APPLICATIONS

This application claims the benefit of U.S. Provisional Application No. 61/506,206 filed on Jul. 11, 2011, and claims the benefit of European Patent Application No. EP11173449.7 filed on Jul. 11, 2011, the contents of both of which are incorporated herein by reference.

BACKGROUND

The invention relates to a passenger seat for a system of passenger seats of an aircraft cabin. The invention also relates to a system of passenger seats attachable to a construction near the floor of an aircraft cabin.

A passenger seat of the aforementioned kind is provided for passengers in an aircraft cabin allocated in the fuselage of the aircraft main body section for holding crew and passengers. A passenger is necessarily for most of the duration of a journey accommodated to the passenger seat. The seats usually are arranged in rows running across the airplane fuselage and the rows are crosswise of an alley along the fuselage. Nowadays a passenger seat is equipped with numeral amenities affecting the functioning of a seat itself like a reclining mechanism, in particular also a tray or a pocket. This may also comprise a seat bottom movement or seat back tilting mechanisms. Also an adjustable arm- or headrest or a massage functionality may be implemented and electronically driven. Whereas some of the aforementioned mechanism can be supported by an electrical drive also mostly in a passenger seat numerous electronic applications are implemented; e.g. these comprise but are not limited to powerports for connection of electronic equipment, implemented screens for moving pictures or audio connection for radio or other multimedia entertainment.

Thus there is a demand to increase a passengers comfort but nevertheless energy consumption caused by the aforementioned passenger seat functionalities should be kept at least limited to a certain acceptable amount. In particular this may affect an adjusting of a seat body or an electronic entertainment or information system of the passenger seat implemented in the seat body. While generally efforts in the prior art are directed to save energy wherever possible it turned out that alternatives to these efforts are desirable.

DESCRIPTION

This is where the invention comes in the object of which is to provide a passenger seat for a system of passenger seats of an aircraft cabin and a system wherein an electrical load of the passenger seat to the cabin electrical network is decreased.

With regard to the passenger seat the object is achieved by the passenger seat as mentioned in the introduction wherein in accordance with the invention the passenger seat comprises:
- a seat body,
- an energy harvesting system for providing electrical energy, in particular for use in the passenger seat electrical net and/or aircraft electrical net, wherein an energy harvesting device of the energy harvesting system is provided to the seat body, wherein
- the energy harvesting device is adapted for capturing from the seat body ambient energy.

The invention has recognized that as an alternative to sole energy saving efforts an energy harvesting system is particular suitable for providing electrical energy which is of use in the passenger seat electrical net either and/or additional an aircraft electrical net. In particular the invention recognized that an energy harvesting system is on the one hand well suited to provide electrical energy for use in low voltage applications. Additionally on the other hand the invention recognized that an energy harvesting system of the instant concept is suited and comfortable to implemented with not only a passenger seat electrical net but also an aircraft electrical net. Thus the invention recognized that the concept of energy harvesting surprisingly can also be provided in complex electrical net appliances like an aircraft electrical net. The invention in particular recognized that energy harvesting can be used to make safety appliances more secure and reliable by means of an energy harvesting system. The invention recognized that once an energy harvesting device is implemented in the seat body the energy harvesting system is suited for providing electrical energy to the passenger seat electrical net and/or aircraft electrical net. Thus also the numerous safety guidelines for cabin equipment on the one hand and also the demands of a complex aircraft electrical network can be fulfilled on basis of the concept of the instant invention.

Further with regard to the system of passenger seats the object of the invention is achieved by a system of passenger seats attachable to a construction near the floor of an aircraft cabin. The system comprises a number of passenger seats of the afore-mentioned kind according to the concept of the invention. For this feature it is claimed independent protection independent from all other features of this disclosure. In particular the system of passenger seats has a number of energy harvesting systems connected to an aircraft electrical network whereas either for each passenger seat an individual energy storing device may be provided and/or a central energy storing device may be provided for the number of energy harvesting devices of each of the number of passenger seats. Thus the system of passenger seats also comprises a number of energy harvesting devices assigned to the number of passenger seats. The number of passenger seats can be grouped in the system of passenger seats attached to a construction near the floor of an aircraft cabin. In particular it is advantageous to group the passenger seats of a row in this regard. In particular it is advantageous to group behind the other passenger seats in groups of two or more passenger seats. The number of energy harvesting devices can be connected in groups to an aircraft electrical net for feeding electrical energy into the aircraft electrical net. Thereby a significant amount of electrical energy is provided for overall lowering an energy consumption in an aircraft cabin.

Further developed configurations of the invention are further outlined in the dependent claims. Thereby the mentioned advantages of the proposed concept are even more improved. For each feature of the dependent claims it is claimed independent protection independent from all other features of this disclosure.

In a particular preferred development the ambient energy is provided by a passenger to the seat body, in particular to a seat's coverage, when placed in the seat.

In a particular preferred development the energy harvesting device provides electrical energy—in a first variant—based on the piezoelectric effect and/or—in a second variant—based on the thermoelectric effect and/or—in a third variant—the solarelectric effect. Thus a passenger and/or an energy harvesting system may comprise energy harvesting devices of only a first kind (e.g. the first variant) or only a second kind (e.g. the second variant) or only a third kind (e.g.

the third variant). Also a passenger seat and/or an energy harvesting system may comprise energy harvesting devices of various combinations of two or three or more kinds. E.g. a combination of two or three kinds, namely e.g. of a first kind (e.g. the first variant) and a second kind (e.g. the second variant) or further kinds, is possible. E.g. also a combination of two or three kinds, namely e.g. of a first kind (e.g. the first variant) and a third kind (e.g. the third variant) or further kinds, is possible. Thus every combination of various kinds of energy harvesting devices in a system or seat is possible. For these features it is claimed independent protection independent from all other features of this disclosure.

One kind of energy harvesting device is preferably adapted for capturing from the cabins surrounding residual light when the seat body is placed in the cabin. Particular preferred the energy harvesting device provides electrical energy based on the solarelectric effect. The development advantageously recognized that always during an aircrafts flight sufficient residual light is available to provide enough light energy to be captured; thereby in particular safety appliances can be provided with an additional self-sufficient electrical energy source. For this feature it is claimed independent protection independent from all other features of this disclosure.

A further kind of energy harvesting device is adapted for capturing from the seat construction ambient energy when the seat construction is attached to a construction near the floor and/or sidewall of an aircraft cabin. Particular preferred the energy harvesting device provides electrical energy based on the piezoelectric effect and/or the thermoelectric effect. For this feature it is claimed independent protection independent from all other features of this disclosure.

With regard to the aforementioned first variant the development recognized that vibrations and relative movement of an aircrafts construction and/or cabin construction and/or seat construction can be captured in high amounts. In particular also vibrations of the cabin floor where the seat construction may be attached can provide energy from steps and strides of the passengers or the crew. Thus this kind of energy inter alia can very efficiently be used to provide electrical energy by means of the piezo-electric effect.

With regard to the aforementioned second variant the development recognized also that temperature differences relative between an aircrafts construction and/or cabin construction and/or seat construction can be captured in high amounts and can very efficiently be used to provide electrical energy by means of the thermo-electric effect. The development recognized that even temperature differences in the range of 1 K are sufficient to provide enough thermo-electric energy to be captured; thereby in particular safety appliances can be provided with an additional self-sufficient electrical energy source. For this feature it is claimed independent protection independent from all other features of this disclosure.

In a particular preferred development of the first variant the energy harvesting device comprises a piezoelectric element or an arrangement or structure of a plurality of piezoelectric elements. In a particular preferred embodiment of the development a piezoelectric element is provided as a piezoelectric fibre or piezoelectric crystal. In particular a piezoelectric fibre is turned out to be particular advantageous, preferably in form of a fabric or sleeve be that it may woven, knitted or otherwise arranged to form a flexible fabric. Thus in a particular preferred embodiment the energy harvesting structure comprises a flexible fabric having at least partly piezoelectric fibres incorporated or consisting fully of piezoelectric fibres. For this feature it is claimed independent protection independent from all other features of this disclosure.

Still a further—very preferred—kind of energy harvesting device is preferably adapted for capturing from the seat coverage ambient energy provided by a passenger to the seat coverage when placed in the seat. A preferred development recognized that the seat body has a stable seat construction inside the seat body and a seat coverage and the energy harvesting device is preferably adapted for capturing from the seat coverage ambient energy provided by a passenger to the seat coverage once placed in the seat; thereby in particular safety appliances can be provided with an additional self-sufficient electrical energy source. For this feature it is claimed independent protection independent from all other features of this disclosure.

In particular it is advantageous that the energy harvesting structure is provided to an inside seat cushion in between an inside seat cushion and an outside seat cover or to an outside seat cover. Advantageously the seat coverage is a flexible seat coverage movable and/or deformable by a passenger when moving in the seat and wherein the energy harvesting device has a flexible energy harvesting structure incorporated in the flexible seat coverage for capturing kinetic energy when the passenger moves in the seat and the energy harvesting structure is adapted to provide electric energy based on the piezoelectric effect. For this feature it is claimed independent protection independent from all other features of this disclosure.

Indeed it turned out that incorporation of an energy harvesting device in form of an energy harvesting structure comprising a piezoelectric fibre is particular advantageous for implementing the energy harvesting device into the seat body. For this feature it is claimed independent protection independent from all other features of this disclosure. Advantageously a piezoelectric fabric comprising a piezoelectric fibre can be provided in a separate sleeve or the like and can be layered in or inbetween a seat cushion and a seat cover of a passenger seat. In another variant the piezoelectric fibre or a plurality thereof is incorporated into the seat cover or incorporated in the seat cushion in a suitable way. In a particular preferred way the piezoelectric fibre or a plurality thereof is woven, knitted or otherwise textile worked into the seat cover. For this feature it is claimed independent protection independent from all other features of this disclosure.

In a further development of the second variant the energy harvesting device can provide electrical energy based on the thermoelectric effect (in particular Seebeck-effect) and comprises one or more Peltier-elements. For this feature it is claimed independent protection independent from all other features of this disclosure.

In a further preferred development of the second variant the seat coverage is a warmable seat coverage capable of being warmed up by a passenger when providing body heat in the seat and wherein the energy harvesting device has an energy harvesting structure incorporated in the warmable seat coverage by capturing heat energy when the passenger warms up the seat coverage and wherein the energy harvesting structure is adapted to provide electric energy based on the thermoelectric effect. For this feature it is claimed independent protection independent from all other features of this disclosure.

Preferably the energy harvesting structure comprises a plate having a number of Peltier elements, in particular double-plate with sandwiched Peltier elements. The plate or double-plate can be stable and preferably moreover flexible for improved incorporation into a seats coverage. For this feature it is claimed independent protection independent from all other features of this disclosure.

Preferably the energy harvesting structure is provided underneath an outside seat cover of a seats coverage. In particular the harvesting structure is placed rather in the upper half of an inside seat cushion of the seat coverage. Thereby it is guaranteed that sufficient body heat of the passenger is conducted to the thermoelectric effect based energy harvesting structure. Nevertheless the passenger is protected from an adverse feeling of being cooled, which may occur but is not expected in the case of an oversized deduction of body heat to the thermoelectric effect based energy harvesting structure. Thus the implementation of a plate of Peltier elements not only is advantageously adapted according to an improved heat flow in the seat and a temperature feeling of the passenger but also according to an improved mechanical incorporation of the plate without any adverse effects to the passenger. Notwithstanding a cooling effect can be in various circumstances, in particular during a long haul-flight, considered as advantageous to improve a passengers comfort; thus positioning and control of a thermo-electric effect based energy harvesting device can be used synergetically on the one hand to capture energy from a passengers body heat and on the other hand to provide a comfortable cooling in body regions and situations of interest.

In a preferred development the energy storing device of the energy harvesting system is a capacitor of rechargeable battery. For this feature it is claimed independent protection independent from all other features of this disclosure. In particular a super capacitor (also known as ultra-capacitor e.g. of a SIEMENS-type or the like) is advantageous because energy can be stored and provided rather quick, due to comparable large load currents. On the other hand a rechargeable battery may provide a comparable high potential for storing energy. Both a super capacitor and/or a rechargeable battery alone or in combination can be used to store electrical energy from captured ambient energy of a passenger seats body. Further the mentioned energy storing devices are particular preferred to provide a suitable connection of the energy harvesting system to the passenger seat electrical net and/or aircraft electrical net.

In a first developed variant of connection concept the energy harvesting system has an energy storing device electrically connected to the energy harvesting device and the energy storing device is assigned only individually to the passenger seat and adapted to provide energy for a load consumers electrically connected to the energy harvesting device and integrated in the passenger seat. For this feature it is claimed independent protection independent from all other features of this disclosure. Thereby rather self-sufficient passenger seat electric net can be provided which—at least in average—is suitable to sufficiently provide a passenger seats electrical appliances with electrical energy; in particular for all load consumers integrated in the passenger seat be that it may be provided for a seat body functionality or an electrical information and entertainment system.

In a second developed variant the energy harvesting system further has an energy storing device electrically connected to the energy harvesting device and the energy storing device is assigned to a number of passenger seats and is adapted to store energy from a number of energy harvesting devices to provide energy for load consumers in the aircraft cabin. For this feature it is claimed independent protection independent from all other features of this disclosure. In the second variant advantageously energy captured from a number of passenger seats is available; preferably the amount of energy captured is comparable increased as compared to the aforementioned self-sufficient system of the first developed variant. Thus advantageously an average of captured energy is available and can be provided to an aircraft electrical net more easily without less adverse net effects. Also the amount of captured energy is sufficient to also provide energy for large voltage load consumers or load consumers having higher load peaks as compared to the afore-mentioned self-sufficient system of the first developed variant.

In a particular preferred embodiment the electrical energy is provided for a load consumer in form of a WLAN- or other wireless-system, in particular communication and/or signalling system, in the aircraft cabin. A WLAN- or other wireless-system turned out to be good candidates for avoiding cables and the like, thus lowering an aircrafts weight. Once sufficient electrical energy can be guaranteed to be available all the time these kind of systems have increased reliability and safety margins. In a particular preferred embodiment the electrical energy is provided for a load consumer in form of a sensoring appliance, in particular a WLAN- or other wireless-system embedded sensoring appliance, in the aircraft cabin. The development recognized that any energy-harvesting system of the aforementioned kind can be used to provide electrical energy to a WLAN- or other wireless-system in the aircraft cabin; in particular for safety appliances. For this feature it is claimed independent protection independent from all other features of this disclosure.

For a more complete understanding of the invention, the invention will now be described in detail with reference to the accompanying drawing. The detailed description will illustrate and describe what is considered as a preferred embodiment of the invention. It should of course be understood that various modifications and changes in form or detail could readily be made without departing from the spirit of the invention. It is therefore intended that the invention may not be limited to the exact form and detail shown and described herein, nor to anything less than the whole of the invention disclosed herein and as claimed hereinafter. Further the features described in the description, the drawing and the claims disclosing the invention may be essential for the invention considered alone or in combination. In particular, any reference signs in the claims shall not be construed as limiting the scope of the invention. The wording "comprising" does not exclude other elements or steps. The wording "a" or "an" does exclude a plurality. The wording, "a number of" items, comprises also the number one, i.e. a single item, and further numbers like two, three, four and so forth.

DESCRIPTION OF THE DRAWINGS

The drawing shows in:

FIG. 1 shows a passenger seat 10 for a system of passenger seats 100 not shown in detail of an aircraft cabin. The passenger seat 10 has a seat body 1 with a stabile seat construction 2 inside the seat body 1 and a seat coverage 3. The seat coverage 3 in this case is built by a seat cushion 3.1 and an outside seat cover 3.2.

Figure 1:
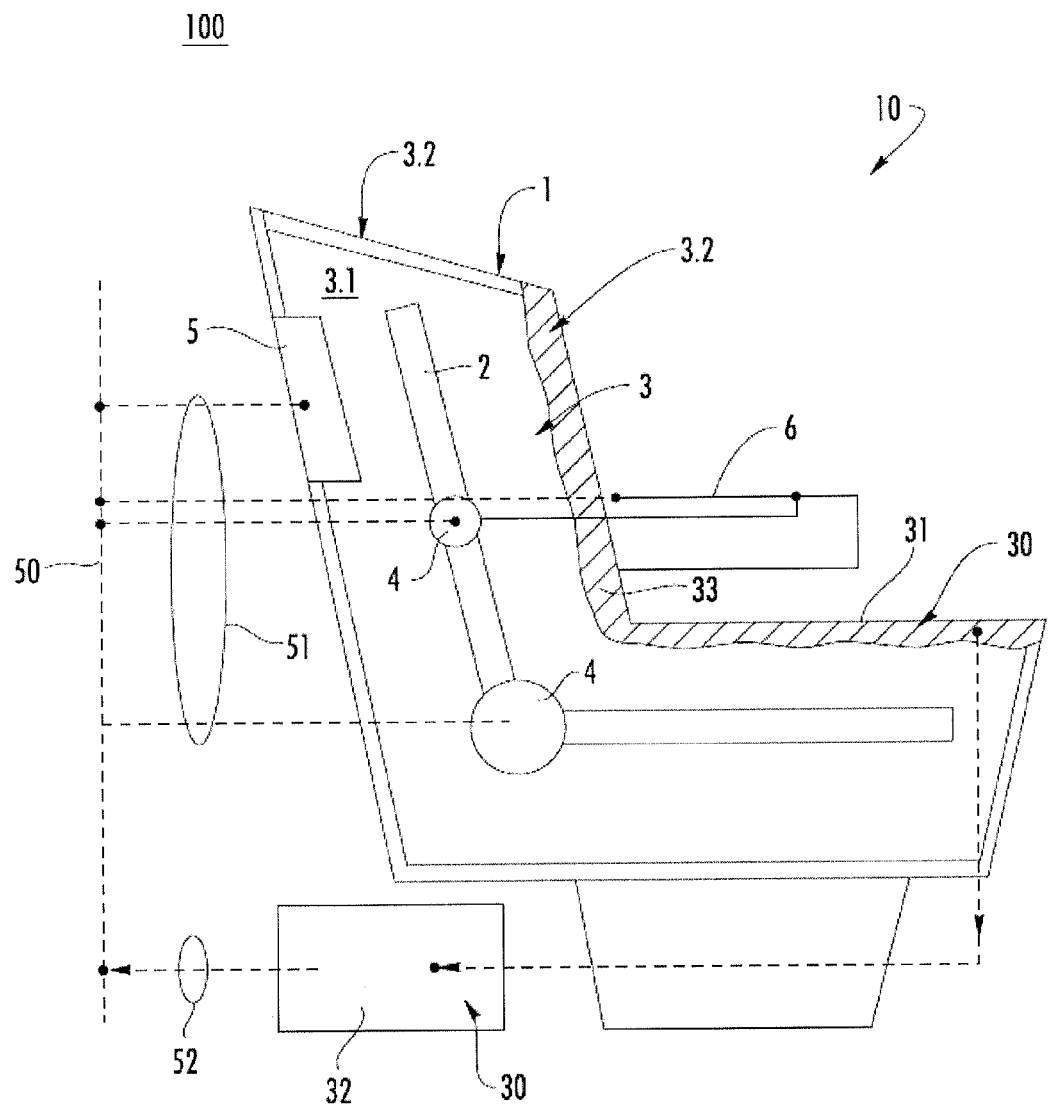
FIG. 1: a first embodiment of a passenger seat for a system of passenger seats of an aircraft cabin, wherein an energy harvesting system is adapted for providing electrical energy for use in the passenger seats electrical net.

Further the passenger seat in the seat body has implemented a number of drives 4 for supporting a seat tilting mechanism, like e.g. an arm rest, head rest or seat back. An electrical entertainment system for instance comprises a video screen 5 or audio output and electrical communication and control modules 6 which are implemented in a seats back and armrest respectively. The electrical aforementioned amenities with numerous electrical components 4, 5, 6 like e.g. the mentioned drives and entertainment system are connected electrically by electric load wiring 51 to a seat electrical net 50 shown in a dashed line for providing electrical energy in the case the electrical components cause an electrical load.

According to the concept of the invention an energy harvesting system is provided with the passenger seat 10. The energy harvesting system 30 in a first embodiment exemplified in FIG. 1 has an energy harvesting device 31 and an energy storing device 32. In the present case of the first embodiment the energy harvesting device 31 and the energy storing device 32 are assigned individually to the passenger seat 10. Alternatively the energy harvesting device 31 and the energy storing device 32 can be assigned individually to the passenger seat 10 and the next passenger seat placed just in front of the one shown; thereby advantageously the energy harvesting system provides energy to all amenities of an individual passenger, namely the mentioned drives 4 and entertainment system 5 including a screen on the backside of a passenger seat placed just in front of the one shown. The passenger seat electrical net is adapted to provide energy for load consumers, namely the aforementioned electrical components 4, 5, 6, connected to the passenger seat electrical net 50 using the electric load wiring 51.

In this embodiment the energy harvesting device 31 is provided in the seat body 1 for capturing energy from the seat body when ambient energy is provided by the passenger to the seat body when placed in the seat. Here the energy harvesting device 31 provides electrical energy based on the piezoelectric effect. The seat coverage 3 is a flexible seat coverage moveable by a passenger when moving in the seat; in particular the outside seat cover 3.2 is deformable when a passenger moves in the seat. The energy harvesting device 31 has a flexible energy harvesting structure incorporated—here by means of woven piezoelectric fibres 33—in the flexible seat cover 3.2 for capturing kinetic energy when the passenger moves in the seat. By way of a piezoelectric effect in the piezoelectric fibres 33 electrical energy can be provided to the energy storing device 32 and to the passenger seat electrical net 50 by means of electric charge wiring 52.

Here the energy harvesting structure comprises a fabric of piezoelectric fibres 33. The harvesting structure in this case serves as the outside seat cover 3.2 wherein the piezoelectric fibre 33 is woven into the seat cover 3.2.

Alternatively, in an embodiment not shown here a piezoelectric fibre 33 can be in cooperated in the seat cushion 3.1.

As shown in FIG. 1 the energy harvesting structure comprises a fabric of piezoelectric fibres 33 and is provided in an outside seat cover 3.2 on a seat back and a seating area. Thus, a rather large surface is available for capturing kinetic energy from a passenger movement be that it may a passengers leg, pelvic region or dorsum of a passenger.

In another embodiment not shown here alternatively or additionally the piezoelectric fibre can be provided in a flexible sleeve and the sleeve can be layered in between the seat cushion 3.1 and the seat cover 3.2.

Figure 2:
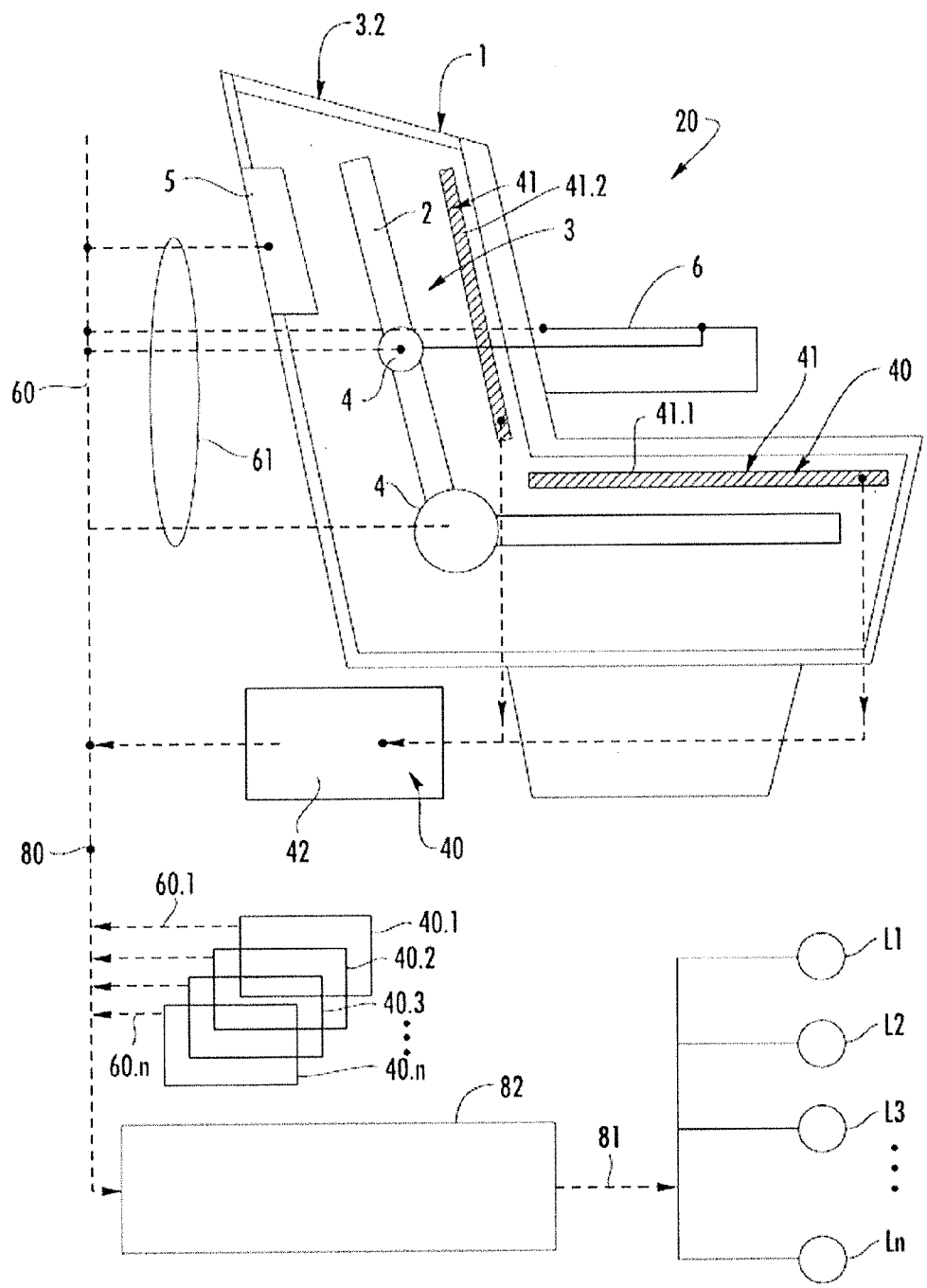
FIG. 2: a second embodiment of a passenger seat for a system of passenger seats of an aircraft cabin, wherein an energy harvesting system is adapted for providing electrical energy for use in the passenger seat electrical net and also additionally or alternatively for use in the aircraft electrical network.

FIG. 2 shows in a second embodiment a passenger seat 20 for a system of passenger seats 200 of an aircraft cabin. For identical or equivalent items or items of identical or equivalent function in the following the same reference marks are used. For corresponding features thus it is referred to the above description. In the following, in particular the differences between the embodiment of a passenger seat 10 and a passenger seat 20 are described.

Whereas the passenger seat 20 also has a seat body 1 and basically the same stabile seat construction 2 and seat coverage 3; here electrical components 4, 5, 6 of load consumers are connected to a passenger seat electrical net 60 by means of electrical load wiring 61. To the passenger seat electrical net 60 also an energy storing device 42 is connected. The energy storing device is implemented in an energy harvesting system 40 which again has an energy harvesting device 41 for capturing from the seat body 1 ambient energy provided by a passenger to the seat when placed in the seat. In the instant embodiment the energy harvesting device 41 uses the thermoelectric effect, also known as the inverse Peltier effect, i. e. the Seebeck effect. The energy harvesting device 41 here comprises a so called Peltier element.

Generally, the energy harvesting device 41 has an energy harvesting structure comprising a plate with Peltier elements or Peltier elements are incorporated in a double plate. Here, two such double plates with Peltier elements are provided; a first plate 41.1 in the seats seating area and a second plate 41.2 in the seats back. Thus the energy harvesting device 40 is provided in a combination of two Peltier plates 41.1, 41.2; both connected by electrical charge wiring to the energy storing device 42.

Warming of the seat coverage 1 allows for capturing heat energy by the Peltier plates 41.1, 41.2 when the passenger warms up the seat coverage 1. Here, the seat coverage 1 has a warmable seat cover 3.2 and cushion 3.1 with improved heat conductivity and capacity; thus capable of being warmed up by a passenger when providing body heat in the seat 20.

The energy storing devices 32, 42 of each of the energy harvesting systems 30, 40 can be formed by a capacitor or rechargeable battery. It turned out that a super capacitor—also known as super cap or ultra cap—is suitable to provide quick storage of electrical energy, i.e. charging and providing of electrical energy is rather quick. Thus a a super capacitor is useful in particular for averaging electrical net fluctuates and the like. However, also a battery or accumulator can be used as an energy storing device 32, 42 and thus provides a large capacity storage, which may be limited in its load currents.

In the present case the aircraft electrical net 80 connects a number of passenger seat electrical nets 60.1, 60.2 . . . 60.n for a predetermined number "n" of passenger seats and energy harvesting systems 40.1 . . . 40.n. The number "n" is rather low when only e.g. three to five seats of a row are connected to a rather small row electrical net. However, also several row electrical nets can be connected to the aircraft electrical net 80 for storing electrical energy in an energy storing device 82 of the aircraft cabin. Thus, numerous load consumers L1 . . . Ln are connected by load wiring 81 to the aircraft electrical net 80. This has the advantage of averaging and maximizing the energy harvesting potential. Thus, also not only low voltage load consumers can be connected and served by a single energy harvesting system—like the one shown in FIG. 1—but also a total of n energy harvesting systems 40.1 . . . 40.n of FIG. 2 are connected together enlarging the overall effect.

In the instant embodiment energy harvesting systems 30, 40 are used E.g. for belt-fastening systems. These are equipped with a transponder to send a check-signal to central safety appliances by means of an aforementioned WLAN- or other wireless-system. The WLAN- or other wireless-system receives electrical energy form one or more of the energy harvesting systems 30, 40.

It is to be understood that a thermoelectric effect based energy harvesting system 40 also can be used for an individual passenger seat electrical net as shown in FIG. 1. Vice versa a piezoelectric effect based energy harvesting system 30 can be used in combination with an aircraft electrical net

80 as shown in FIG. 2. Also it is to be understood that a combination of energy harvesting systems 30, 40 in single passenger seats not shown here can be used. For instance, an piezoelectric effect based energy harvesting system can be provided in a seat back whereas a thermoelectric based energy harvesting system can be provided in the seating area of the passenger seat and vice versa.

The invention claimed is:

1. A system of passenger seats of an aircraft cabin, each passenger seat comprising:
   a seat body;
   at least one load consuming device; and
   an energy harvesting system for providing electrical energy, the energy harvesting system comprising an energy harvesting device provided to the seat body, wherein:
   an aircraft electrical net connects a number of passenger seat electrical nets for a predetermined number of passenger seats such that each passenger seat electrical net connects a respective energy harvesting system for the predetermined number of passenger seats;
   load wiring connects the aircraft electrical net to each of the at least one load consuming devices for the predetermined number of passenger seats; and
   each energy harvesting device for the predetermined number of passenger seats is adapted for capturing ambient energy from the seat body and each energy harvesting system is configured to transfer electrical energy from each energy harvesting device to both (1) at least one of the number of passenger seat electrical nets and (2) the aircraft electrical net.

2. The system of passenger seats of claim 1 wherein the ambient energy is provided by a passenger to the seat body when the passenger is disposed in the seat body.

3. The system of passenger seats of claim 1 wherein the ambient energy is provided to the seat body by a construction of the aircraft cabin to which the seat body is attached.

4. The system of passenger seats of claim 1 wherein each energy harvesting device provides electrical energy based on a piezoelectric effect, a thermoelectric effect, or a solarelectric effect.

5. The system of passenger seats of claim 1 wherein the seat body comprises:
   a stable seat construction inside the seat body; and
   a seat coverage comprising an inside seat cushion and an outside seat cover, wherein:
   each energy harvesting device is configured such that the ambient energy is provided by a passenger to the seat coverage when the passenger is disposed in the seat body;
   each energy harvesting device is adapted for capturing ambient energy from the stable seat construction when the stable seat construction is mounted near a floor and a sidewall of the aircraft cabin; or
   each energy harvesting device is adapted for capturing residual light from the aircraft cabin when the seat body is placed in the aircraft cabin.

6. The system of passenger seats of claim 1 wherein a seat coverage is flexible such that the seat coverage is movable and deformable based on movement of a passenger disposed in the seat body, wherein:
   each energy harvesting device comprises a flexible energy harvesting structure incorporated in the seat coverage for capturing kinetic energy when the passenger moves in the seat body; and
   each flexible energy harvesting structure is adapted to provide electrical energy based on a piezoelectric effect.

7. The system of passenger seats of claim 1 wherein each energy harvesting device comprises an energy harvesting structure and each energy harvesting structure comprises a fabric having a multitude of piezoelectric fibers.

8. The system of passenger seats of claim 1 wherein a piezoelectric fiber is woven into a seat cover or is incorporated in a seat cushion.

9. The system of passenger seats of claim 1 wherein a piezoelectric fiber is provided in a flexible sleeve and the flexible sleeve is layered adjacent to a seat cushion and a seat cover.

10. The system of passenger seats of claim 1 wherein:
    a warmable seat coverage is configured to be capable of being warmed up by body heat of a passenger in the seat body;
    each energy harvesting device comprises an energy harvesting structure incorporated in the warmable seat coverage for capturing heat energy when the passenger warms up the warmable seat coverage; and
    each energy harvesting structure is adapted to provide electrical energy based on a thermo-electric effect.

11. The system of passenger seats of claim 1 wherein each energy harvesting device comprises an energy harvesting structure and each energy harvesting structure comprises a plate of Peltier-elements.

12. The system of passenger seats of claim 1 wherein each energy harvesting device comprises an energy harvesting structure and each energy harvesting structure comprises a solar cell.

13. The system of passenger seats of claim 1 wherein each energy harvesting system further comprises an energy storing device electrically connected to the energy harvesting device such that each energy storing device is assigned individually to the passenger seat and is adapted to provide energy for each of the at least one load consuming devices electrically connected to the passenger seat electrical net and integrated in the passenger seat.

14. The system of passenger seats of claim 13 wherein each energy storing device is a capacitor, a super capacitor, or a rechargeable battery.

15. The system of passenger seats of claim 1 wherein each energy harvesting system further comprises an energy storing device electrically connected to the energy harvesting device and each energy storing device is assigned to a number of passenger seats and is adapted to store energy from a number of energy harvesting devices to provide energy for each of the at least one load consuming devices in the aircraft cabin.

16. The system of passenger seats of claim 1 wherein the energy is provided for each of the at least one load consuming devices in form of a WLAN- or other wireless-system in the aircraft cabin.

17. An aircraft cabin comprising the system of passenger seats of claim 1, wherein the seat bodies are attached to a construction near a floor of the aircraft cabin.

18. The system of passenger seats of claim 1 wherein each energy harvesting device provides electrical energy based on a piezoelectric effect, a thermoelectric effect, and a solarelectric effect.

19. The system of passenger seats of claim 1 wherein the seat body comprises:
    a stable seat construction inside the seat body; and
    a seat coverage comprising an inside seat cushion and an outside seat cover, wherein:
    each energy harvesting device is configured such that the ambient energy is provided by a passenger to the seat coverage when the passenger is disposed in the seat body;

each energy harvesting device is adapted for capturing ambient energy from the stable seat construction when the stable seat construction is mounted near a floor and a sidewall of the aircraft cabin; and each energy harvesting device is adapted for capturing residual light from the aircraft cabin when the seat body is placed in the aircraft cabin.

20. The system of passenger seats of claim 1 wherein the seat body comprises:

a stable seat construction inside the seat body; and a seat coverage comprising an inside seat cushion and an outside seat cover, wherein each energy harvesting device is configured such that the ambient energy is provided by (1) body heat of a passenger transferred to the seat coverage and (2) kinetic energy of the passenger transferred to the seat coverage when the passenger is disposed in the seat body.

21. The system of passenger seats of claim 1 wherein each passenger seat electrical net comprises a seat energy storing device and the aircraft electrical net comprises an aircraft energy storing device such that the electrical energy transferred from each energy harvesting device is stored in both the seat energy storing devices and the aircraft energy storing device.

22. The system of passenger seats of claim 21 wherein the electrical energy transferred from the energy harvesting devices is sufficient to charge both the seat energy storing devices and the aircraft energy storing device.

23. The system of passenger seats of claim 21 wherein the electrical energy transferred from the energy harvesting devices is sufficient to charge a battery.

* * * * *

UNITED STATES PATENT AND TRADEMARK OFFICE
CERTIFICATE OF CORRECTION

| | | |
|---|---|---|
| PATENT NO. | : 8,979,194 B2 | Page 1 of 1 |
| APPLICATION NO. | : 13/546003 | |
| DATED | : March 17, 2015 | |
| INVENTOR(S) | : Gunter Boomgarden et al. | |

It is certified that error appears in the above-identified patent and that said Letters Patent is hereby corrected as shown below:

ON THE TITLE PAGE:

In the Foreign Application Priority Data section, Item (30), the priority number is missing a number and should be --11173449.7--.

Signed and Sealed this
Twenty-sixth Day of January, 2016

Michelle K. Lee
*Director of the United States Patent and Trademark Office*